(12) United States Patent  
Ku et al.

(10) Patent No.: US 7,332,787 B2
(45) Date of Patent: Feb. 19, 2008

(54) STRUCTURE FOR REALIZING INTEGRATED CIRCUIT HAVING SCHOTTKY BIODE AND METHOD OF FABRICATING THE SAME

(75) Inventors: Ja-nam Ku, Yongin-si (KR); Seong-hearn Lee, Seoul (KR); Il-jong Song, Suwon-si (KR); Young-hoon Min, Anyang-si (KR); Sang-wook Kwon, Seongnam-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 39 days.

(21) Appl. No.: 11/147,164

(22) Filed: Jun. 8, 2005

(65) Prior Publication Data
US 2005/0269658 A1  Dec. 8, 2005

(30) Foreign Application Priority Data
Jun. 8, 2004   (KR)  .................. 10-2004-0041947

(51) Int. Cl.
*H01L 29/732* (2006.01)
(52) U.S. Cl. .................. 257/471; 257/532; 438/379
(58) Field of Classification Search ............... None
See application file for complete search history.

(56) References Cited

U.S. PATENT DOCUMENTS 6,952,560 B2 * 10/2005 Feibig et al. ............... 455/41.1

FOREIGN PATENT DOCUMENTS

JP       2003330039         11/2003

* cited by examiner

*Primary Examiner*—Leonardo Andujar
(74) *Attorney, Agent, or Firm*—Sughrue Mion, PLLC

(57) ABSTRACT

An integrated circuit structure in which a plurality of Schottky diodes and a capacitor are integrally formed. The integrated circuit structure includes a substrate including an N-type semiconductor doped with N-type impurities and a P-type semiconductor doped with P-type impurities; a first conductive layer laminated on the substrate so that the first conductive layer is electrically connected to the N-type semiconductor and the P-type semiconductor; a dielectric layer laminated on an upper surface of the first conductive layer; and a second conductive layer laminated on an upper surface of the dielectric layer so that the second conductive layer forms a capacitor together with the first conductive layer and the dielectric layer. Accordingly, when the integrated circuit structure is used in a rectification circuit, the size of an entire circuit can be reduced.

7 Claims, 4 Drawing Sheets

STRUCTURE FOR REALIZING INTEGRATED CIRCUIT HAVING SCHOTTKY BIODE AND METHOD OF FABRICATING THE SAME

CROSS-REFERENCE TO RELATED APPLICATIONS

This application claims priority from Korean Patent Application No. 2004-41947, filed on Jun. 8, 2004, in the Korean Intellectual Property Office, the disclosure of which is incorporated herein in its entirety by reference.

BACKGROUND OF THE INVENTION

1. Field of the Invention

Apparatuses and methods consistent with the present invention relate to an integrated circuit structure and fabricating the same, and more particularly, to an integrated circuit structure in which at least one Schottky diode and a capacitor are integrally realized and fabricating the same.

2. Description of the Related Art

With the recent development of wireless technology, wireless identification systems are used in a wide range of applications such as a simple prepayment bus card, an admission ticket for a parking place, and an entrance card of a research institute. Wireless identification systems basically perform their functions through exchange of radio frequency signals between a wireless identification tag and a reader unit. That is, when the tag transmits basic data required for identification to the reader unit, the reader unit receives and confirms the basic data. The tag may be manufactured in various forms such as cards, stickers, adhesive, etc., in accordance with the convenience of a user and the uses of the tag.

Wireless identification systems may be also applied for identification for articles in addition to identification for persons. That is, when an object having a tag is a person, basic data may include a name, date of birth, identity, qualification, etc. Further, when the object having the tag is an article, the basic data include a type, date of manufacture, manufacturer, place of origin, etc.

In the meantime, wireless identification systems may be classified into active wireless identification systems and passive wireless identification systems according to methods for operating an integrated circuit (IC) included in a tag. The active wireless identification system operates the IC by means of a battery included in the tag. The passive wireless identification system induces induced current by means of magnetic wave transmitted from a reader unit and operates the IC. In general, the passive wireless identification system is used because a light weight tag may be manufactured due to the non-existence of a battery.

FIG. 1 is a block diagram showing the general construction of a passive wireless identification system. Referring to FIG. 1, a passive wireless identification system includes a tag 10 and a reader unit 20. The tag 10 generally includes an antenna 11, a rectifier 12, a controller 13, a memory 14 and a transmission signal generator 15.

The antenna 11 may be constructed by a coil made from predetermined conductive material. Accordingly, when magnetic wave is received from the reader unit 20, the antenna 11 generates induced current according to Faraday's law. The generated induced current is converted into constant voltage having a predetermined size by the rectifier 12 and operates the controller 13.

The controller 13 extracts basic data stored in the memory 14. Then, the controller 13 controls the transmission signal generator 15 so as to modulate the basic data and generate radio frequency signals.

The generated radio frequency signals are transmitted to the reader unit 20 through the antenna 11. Accordingly, the reader unit 20 demodulates the received radio frequency signals and confirms the basic data.

In order to convert input signals induced in the antenna 11 into constant voltage, a rectifier may be constructed by means of a voltage doubler, etc. In such a case, when a general diode is used, detection efficiency for input signals having a low power deteriorates due to the high forward turn-on voltage of a p-n diode. In order to prevent the deterioration of such detection efficiency, research for using a Schottky diode having a low forward turn-on voltage has been actively pursued. In particular, for recent use in various industry fields such as a physical distribution transportation system, a wireless identification system operating in a high frequency band has been developed. In such a wireless identification system, it is general to fabricate a tag by means of a Schottky diode.

Further, when a rectifier is constructed by means of a plurality of Schottky diodes and capacitors, the rectifier has an increased area, so that the tag 10 has an increased size. Therefore, it is difficult to use the tag 10 in various industry fields. In addition, leakage current generates in a combination process between elements, so that voltage efficiency is reduced.

SUMMARY OF THE INVENTION

The present invention provides an integrated circuit structure and a fabricating method for the integrated circuit structure, which can minimize the area of the integrated circuit structure and decrease parasitic component by integrally fabricating an integrated circuit including at least one Schottky diode and a capacitor by means of semiconductor technology.

According to an aspect of the present invention, there is provided an integrated circuit structure comprising: a substrate including an N-type semiconductor doped with N-type impurities and a P-type semiconductor doped with P-type impurities; a first conductive layer laminated on the substrate so that the first conductive layer is electrically connected to the N-type semiconductor and the P-type semiconductor; a dielectric layer laminated on an upper surface of the first conductive layer; and a second conductive layer laminated on an upper surface of the dielectric layer so that the second conductive layer forms a capacitor together with the first conductive layer and the dielectric layer.

The first conductive layer combines with the P-type semiconductor to form a first Schottky diode connected in series to a capacitor and combines with the N-type semiconductor to form a second Schottky diode connected in parallel to a capacitor.

The integrated circuit structure may further include electrodes electrically connected to the N-type semiconductor and the P-type semiconductor.

According to another aspect of the present invention, an integrated circuit structure can be fabricated by means of an N-type substrate including a P-type semiconductor doped with P-type impurities.

According to another aspect of the present invention, the integrated circuit structure may be fabricated using a P-type substrate including an N-type semiconductor doped with N-type impurities.

According to another aspect of the present invention, there is provided a method of fabricating an integrated circuit structure comprising: fabricating a substrate including an N-type semiconductor area and a P-type semiconductor area; laminating a first conductive layer electrically connected to the N-type semiconductor area and the P-type semiconductor area; laminating a dielectric layer on a surface of the substrate including the first conductive layer, patterning the dielectric layer, and exposing predetermined portions of the N-type semiconductor area and the P-type semiconductor area; and laminating a second conductive layer on an upper surface of the dielectric layer laminated on the first conductive layer, thereby forming a capacitor.

The method of fabricating an integrated circuit structure may further comprise forming electrodes by laminating conductive material on the exposed predetermined portions of the N-type semiconductor area and the P-type semiconductor area. Further, electrodes and a second conductive layer can be integrally fabricated by laminating the same conductive material on the surface of a substrate and patterning the conductive material.

In the present invention, the fabricating the substrate comprises doping two areas of the substrate with N-type impurities and P-type impurities, respectively. Further, an integrated circuit structure may be fabricated by doping a predetermined area of an N-type substrate with P-type impurities or a predetermined area of a P-type substrate with N-type impurities.

The first conductive layer and the second conductive layer may be composed of metal, amorphous silicon or polysilicon.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Hereinafter, exemplary embodiments of the present invention will now be described in detail with reference to the accompanying drawings.

Figure 1:
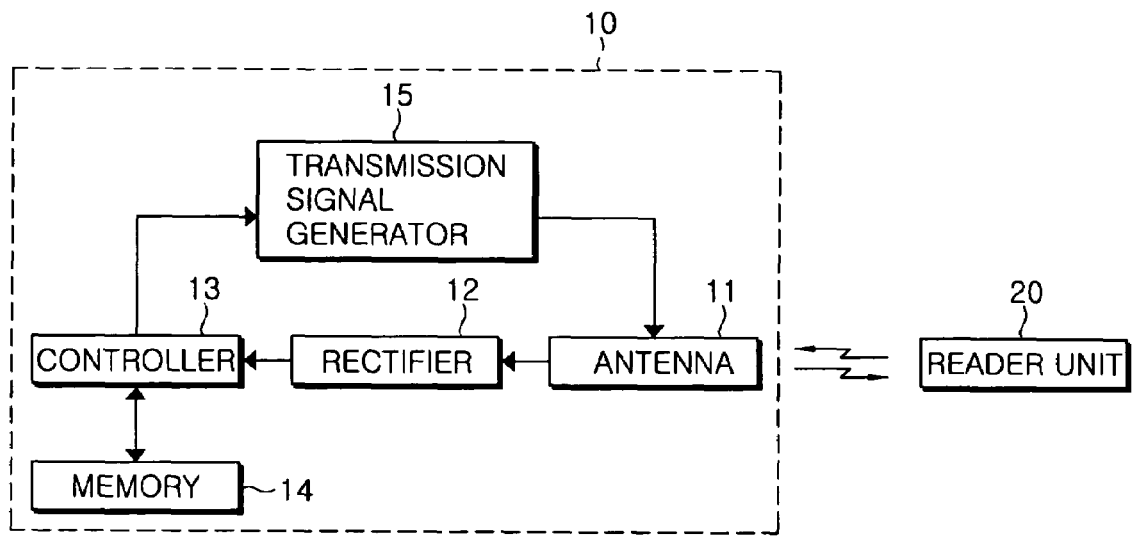
FIG. 1 is a block diagram showing the general construction of a wireless identification system.
Figure 2:
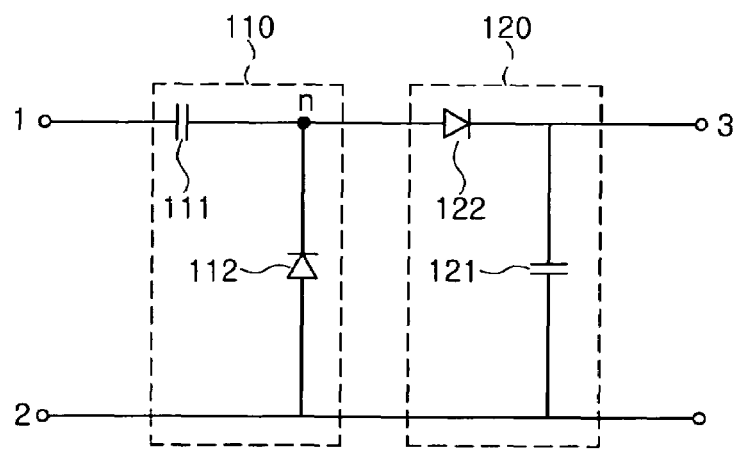
FIG. 2 is a circuit diagram showing the general construction of a voltage doubler circuit used in a wireless identification tag constituting a wireless identification system.

FIG. 2 is a circuit diagram of a general voltage doubler circuit capable of being used as a rectifier in a tag constituting a wireless identification system. Since the voltage doubler circuit can increase the voltage of an input signal by a factor of two, it is generally used in a rectifier, a detector, etc., of a high frequency receiver.

Referring to FIG. 2, the voltage doubler circuit includes a serial connection of two circuits, that is, a clamp circuit 110 and a peak rectification circuit 120. The clamp circuit 110 includes a first capacitor 111 and a first Schottky diode 112, and the peak rectification circuit 120 includes a second capacitor 121 and a second Schottky diode 122.

Accordingly, when an input signal is an alternating current voltage having an amplitude of $\pm V_p$, an output voltage at a node n is clamped as a signal having an upper peak of $2V_p$ and a lower peak of 0. That is, the input signal is charged in the first capacitor 111 in a negative voltage interval. Then, the voltage charged in the first capacitor 111 and the input voltage are added and thus the clamped signal is outputted in a positive voltage interval. Such a waveform is applied to the peak rectification circuit 120, so that a direct current voltage having a magnitude of $2V_p$ is outputted from both ends of the second capacitor 121.

Figure 3:
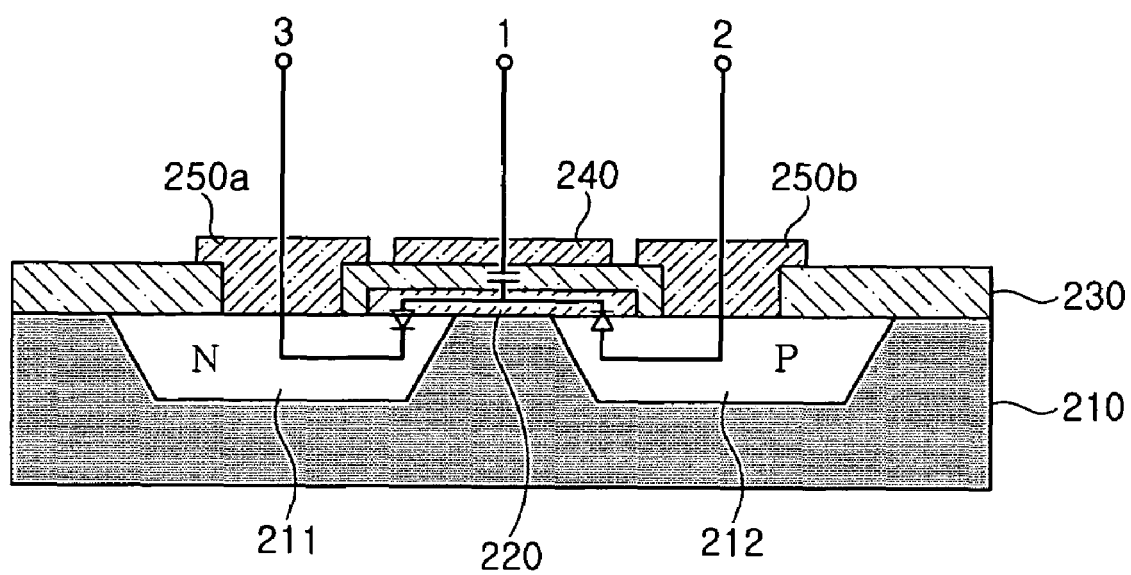
FIG. 3 is a view showing the construction of an integrated circuit structure according to an exemplary embodiment of the present invention.

FIG. 3 is a view showing the construction of an integrated circuit structure according to an exemplary embodiment of the present invention. Referring to FIG. 3, the integrated circuit structure includes a substrate 210, a first conductive layer 220, a dielectric layer 230, a second conductive layer 240, and electrodes 250a and 250b. The first conductive layer 220 and the second conductive layer 240 are formed of a conductive material including pure metal, mixed metal and/or silicide.

The substrate 210 includes predetermined areas doped with N-type impurities and P-type impurities. In such a case, the substrate 210 is formed of a pure single crystal material such as silicon or compound semiconductor. Accordingly, a doping work of implanting impurity P, As, Sb, Bi, etc., which has a valence of five, into the predetermined area of the substrate 210 is performed, so that an N-type semiconductor 211 is formed. Similarly, a doping work of implanting impurity B, Al, Ga, In, etc., which has a valence of three, into the another predetermined area of the substrate 210 is performed, so that a P-type semiconductor 212 is formed.

The first conductive layer 220 is electrically connected to the N-type semiconductor 211 and the P-type semiconductor 212. Accordingly, the first conductive layer 220 is connected to the P-type semiconductor 212 to form the first Schottky diode 112. As described above, the Schottky diode is manufactured by combining a semiconductor and a conductor. In such a case, the first conductive layer 220 becomes a cathode and the P-type semiconductor 212 becomes an anode.

Further, the first conductive layer 220 is connected to the N-type semiconductor 211 to form the second Schottky diode 122. In such a case, the first conductive layer 220 becomes an anode and the N-type semiconductor 211 becomes a cathode.

The dielectric layer 230 is laminated on a surface of the substrate 210 and an upper surface of the first conductive layer 220. The dielectric layer 230 functions as dielectric between both electrodes of the capacitor 110 and is manufactured by means of a typical insulator such as $SiO_2$ or $Si_3N_4$.

The second conductive layer 240 is located on the upper surface of the dielectric layer 230 including the first conductive layer 220 located below the dielectric layer 230. Accordingly, the second conductive layer 240 forms both electrodes of the capacitor 110 together with the first conductive layer 220.

As described above, the first conductive layer 220 and the second conductive layer 240 may be composed of a material such as metal, amorphous silicon, polysilicon, etc.

Further, the electrodes 250a and 250b are formed on exposed portions of the N-type semiconductor 211 and the P-type semiconductor 212, respectively. Therefore, the first Schottky diode 112 is connected to an external terminal 2 and the second Schottky diode 122 is connected to an external terminal 3.

Accordingly, the integrated circuit structure according to an exemplary embodiment of the present invention forms one integrated circuit, which includes the first capacitor 111, the first Schottky diode 112 in which the first capacitor 111 and the cathode portion are connected to each other, and the second Schottky diode 122 in which the first capacitor 111 and the anode portion are connected to each other, etc., in the voltage doubler circuit shown in FIG. 2.

Figure 4A:
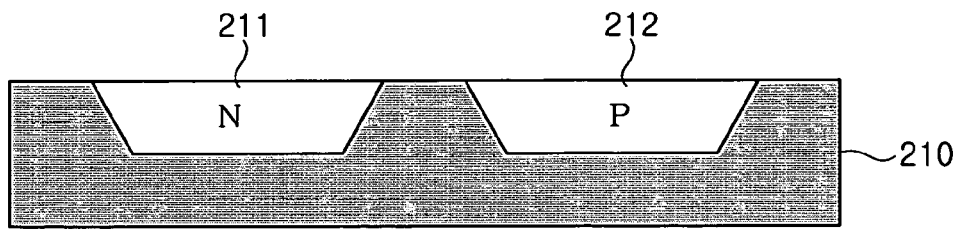
FIGS. 4A to 4D are views of fabrication processes showing a method for fabricating the integrated circuit structure in FIG. 3 according to an exemplary embodiment of the present invention.

FIGS. 4A to 4D are views of fabrication processes showing a method for fabricating the integrated circuit in FIG. 3 according to an exemplary embodiment of the present invention. Referring to FIG. 4A, the N-type semiconductor 211 and the P-type semiconductor 212 are formed in predetermined areas of the substrate 210, respectively.

Figure 4B:
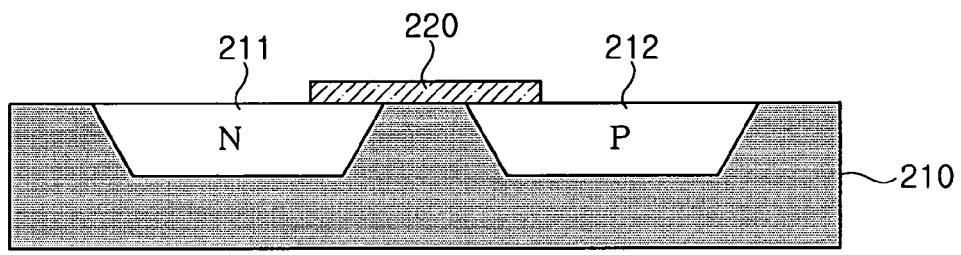

Next, as shown in FIG. 4B, conductive material is laminated on the surface of the substrate 210 and then the laminated conductive material is patterned, so that the first conductive layer 220 electrically connected to the N-type semiconductor 211 and the P-type semiconductor 212 is formed. The first conductive layer 220 functions as one electrode of the capacitor 110. Further, the first conductive layer 220 plays a role of forming the first Schottky diode 112 and the second Schottky diode 122 together with the N-type semiconductor 211 and the P-type semiconductor 212.

Figure 4C:
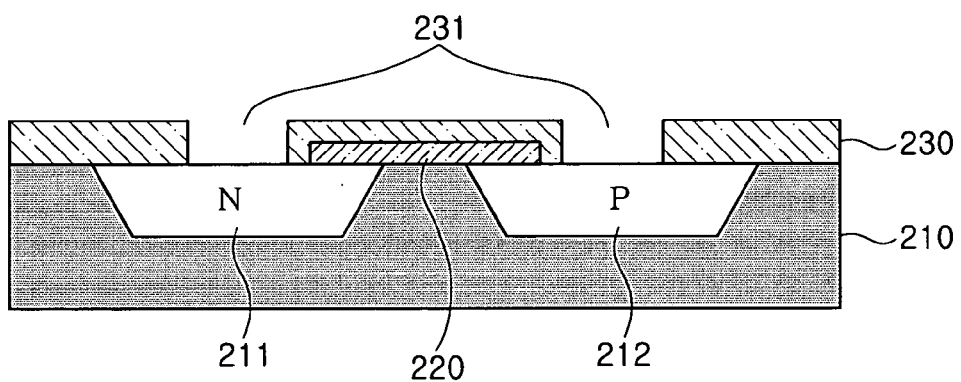

Next, as shown in FIG. 4C, the dielectric layer 230 is laminated on the entire surface of the substrate 210 and the first conductive layer 220 and then, the laminated dielectric layer 230 is patterned, so that predetermined areas 231 of the N-type semiconductor 211 and the P-type semiconductor 212 are exposed. As will be described later, exposed areas 231 are used in forming the electrodes 250a and 250b by means of a conductive material.

Figure 4D:
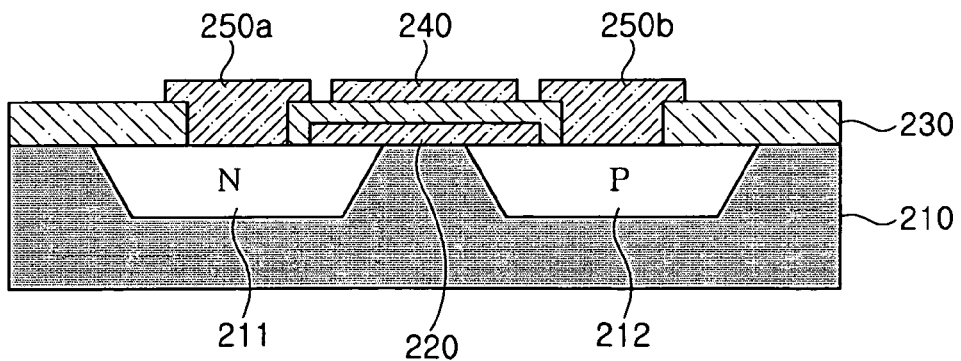

Next, as shown in FIG. 4D, the second conductive layer 240 and the electrodes 250a and 250b are formed. In such a case, the conductive material is laminated on the entire surface of the dielectric layer 230 and the exposed areas 231, and the conductive material is patterned, so that the second conductive layer 240 and the electrodes 250a and 250b can be simultaneously formed. Accordingly, the second conductive layer 240 forms both electrodes 250a and 250b of the capacitor 110 together with the first conductive layer 220.

When the integrated circuit as shown in FIG. 4D is finally formed, the second conductive layer 240 and the electrodes 250a and 250b can be connected to an external circuit for use. That is, the second capacitor 121 is connected between the electrodes 250a and 250b, so that the integrated circuit can be used as a voltage doubler circuit.

Figure 5:
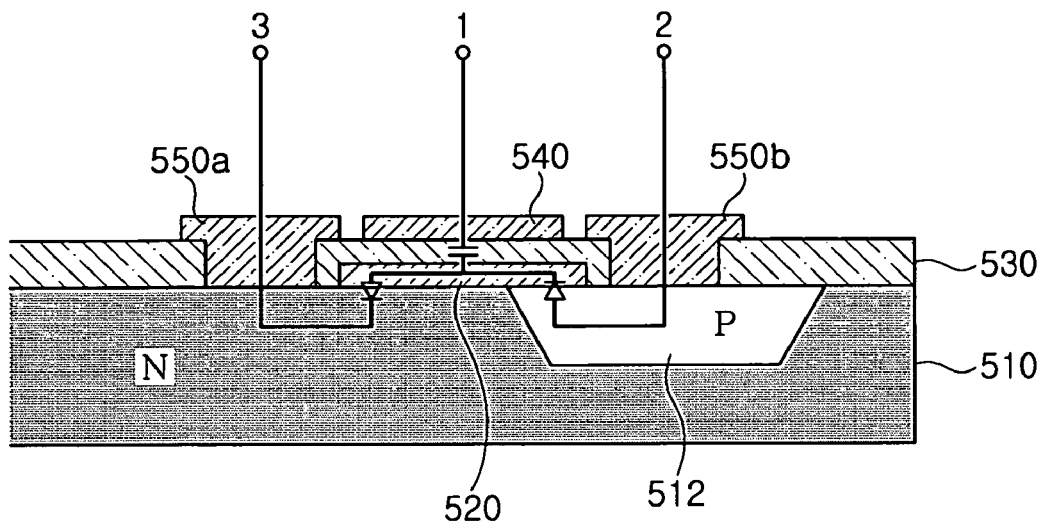
FIGS. 5 and 6 are sectional views showing the construction of integrated circuit structures according to other exemplary embodiments of the present invention.

FIG. 5 is a sectional view showing the construction of an integrated circuit structure according to another exemplary embodiment of the present invention. Referring to FIG. 5, an N-type substrate 510 doped with N-type impurities is used instead of a typical silicon substrate. Accordingly, a P-type semiconductor 512 is formed in a predetermined area of the N-type substrate 510. Herein, the remaining portions excluding the N-type substrate 510 are identical to those shown in FIG. 3. That is, the integrated circuit structure includes a first conductive layer 520 laminated on the N-type substrate 510 and the P-type semiconductor 512, a dielectric layer 530 laminated on a predetermined area of the N-type substrate 510 including the first conductive layer 520, a second conductive layer 540 laminated on the upper surface of the dielectric layer 530 to form a capacitor together with the first conductive layer 520, electrodes 550a and 550b electrically connected to the N-type substrate 510 and the P-type semiconductor 512, respectively, etc.

Figure 6:
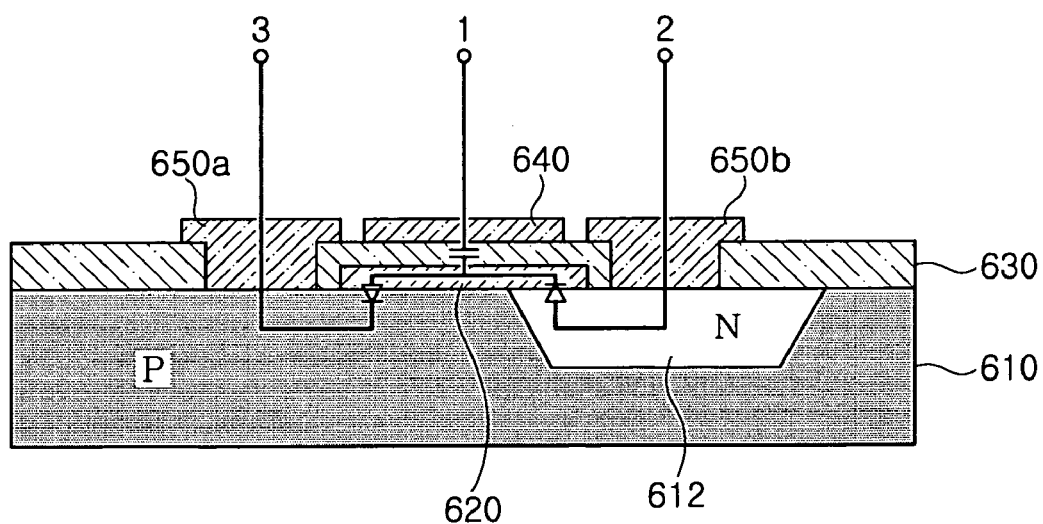

FIG. 6 is a sectional view showing the construction of an integrated circuit structure according to another exemplary embodiment of the present invention. Referring to FIG. 6, a P-type substrate 610 doped with P-type impurities is used, which includes an N-type semiconductor 612 doped with N-type impurities. Similarly to the case of FIG. 5, since a first conductive layer 620, a dielectric layer 630, a second conductive layer 640, electrodes 650a and 650b, etc., have the same construction and function as those in FIG. 3, a detailed description will be omitted.

Except for the substrates, fabrication of the integrated circuit structures of FIGS. 5 and 6 is identical to the fabricating method of FIGS. 4B to 4D. That is, in fabricating the substrate, the integrated circuit structures in FIGS. 5 and 6 are different from the integrated circuit structure in FIG. 3 in that the integrated circuit structures of FIGS. 5 and 6 use the N-type substrate 510 and the P-type substrate 610, respectively, and only predetermined areas in the substrates are doped with P-type impurities and N-type impurities, respectively. Therefore, separate drawings and detailed descriptions regarding the fabrication method of the integrated circuit structures of FIGS. 5 and 6 will be omitted.

Such a voltage doubler circuit can be used in generating a driving voltage having a magnitude enough to operate the controller 13 from a weak input signal in a wireless identification tag constituting a passive wireless identification system.

As described above, according to the present invention, a capacitor and plural Schottky diodes are fabricated as one integrated circuit, so that a rectification circuit can have a reduced size. Therefore, when the integrated circuit is used in a wireless identification tag constituting a wireless identification system, the tag can have a reduced size. Further, the length of a connection path between elements is reduced, so that parasitic component can be prevented from occurring. Therefore, voltage efficiency is improved.

While the present invention has been particularly shown and described with reference to exemplary embodiments depicted in the drawings, it will be understood by those of ordinary skill in the art that various changes and modifications in form and details may be made therein without departing from the spirit and scope of the present invention. Therefore, the spirit and scope of the present invention is defined by the following claims.

What is claimed is:

1. An integrated circuit structure comprising:
   a substrate including an N-type semiconductor doped with N-type impurities and a P-type semiconductor doped with P-type impurities;
   a first conductive layer which contacts and is electrically connected to the N-type semiconductor and the P-type semiconductor;
   a dielectric layer disposed on an upper surface of the first conductive layer; and
   a second conductive layer disposed on an upper surface of the dielectric layer, wherein the second conductive layer, the first conductive layer and the dielectric layer form a capacitor,
   wherein the first conductive layer and the P-type semiconductor form a first Schottky diode connected in series to the capacitor, and the first conductive layer and the N-type semiconductor form a second Schottky diode connected in parallel to the capacitor.

2. The integrated circuit structure as claimed in claim 1, further comprising first and second electrodes which are disposed on the N-type semiconductor and the P-type semiconductor, respectively, and enable the N-type semiconductor and the P-type semiconductor to be electrically connected to external terminals.

3. The integrated circuit structure as claimed in claim 1 wherein the first conductive layer and the second conductive layer are metal, amorphous silicon or polysilicon.

4. An integrated circuit structure comprising:
an N-type substrate including a P-type semiconductor doped with P-type impurities;
a first conductive layer which contacts and is electrically connected to the N-type substrate and the P-type semiconductor;
a dielectric layer disposed on an upper surface of the first conductive layer; and
a second conductive layer disposed on an upper surface of the dielectric layer, wherein the second conductive layer, the first conductive layer and the dielectric layer form a capacitor,
wherein the first conductive layer and the P-type semiconductor form a first Schottky diode connected in series to the capacitor, and the first conductive layer and the N-type substrate form a second Schottky diode connected in parallel to the capacitor.

5. The integrated circuit structure as claimed in claim 4, further comprising first and second electrodes which are disposed on the N-type substrate and the P-type semiconductor, respectively, and enable the N-type substrate and the P-type semiconductor to be electrically connected to external terminals.

6. An integrated circuit structure comprising:
a P-type substrate including an N-type semiconductor doped with N-type impurities;
a first conductive layer which contacts and is electrically connected to the P-type substrate and the N-type semiconductor;
a dielectric layer disposed on an upper surface of the first conductive layer; and
a second conductive layer disposed on an upper surface of the dielectric layer, wherein the second conductive layer, the first conductive layer and the dielectric layer form a capacitor,
wherein the first conductive layer and the N-type semiconductor form a first Schottky diode connected in series to the capacitor, and the first conductive layer and the P-type substrate form a second Schottky diode connected in parallel to the capacitor.

7. The integrated circuit structure as claimed in claim 6, further comprising first and second electrodes which are disposed on the P-type substrate and the N-type semiconductor, respectively, and enable the P-type substrate and the N-type semiconductor to be electrically connected to external terminals.

* * * * *